United States Patent
Sarkar et al.

(10) Patent No.: US 6,731,031 B2
(45) Date of Patent: May 4, 2004

(54) APPARATUS AND METHOD FOR HEAT SINK DEVICE

(75) Inventors: Debabrata Sarkar, Anderson, IN (US); Michael Duane Bradfield, Anderson, IN (US); Olen L. Phillips, Anderson, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 10/266,835

(22) Filed: Oct. 8, 2002

(65) Prior Publication Data

US 2004/0066102 A1 Apr. 8, 2004

(51) Int. Cl.⁷ .............................................. H02K 19/36
(52) U.S. Cl. ...................................... 310/68 D; 310/71
(58) Field of Search ................................ 310/68 D, 71, 310/65, 66

(56) References Cited

U.S. PATENT DOCUMENTS

| | | | | |
|---|---|---|---|---|
| 3,602,793 A | * | 8/1971 | Grozinger | 310/68 D |
| 3,778,650 A | * | 12/1973 | Tharman | 310/68 D |
| 3,852,627 A | * | 12/1974 | Davis | 310/13 |
| 5,453,648 A | | 9/1995 | Bradfield | 310/71 |
| 5,812,388 A | | 9/1998 | Keidar et al. | 363/145 |
| 5,955,805 A | * | 9/1999 | Chaudoreille et al. | 310/90 |
| 6,205,024 B1 | | 3/2001 | Shih et al. | 361/704 |
| 6,285,100 B1 | | 9/2001 | Pflueger et al. | 310/68 D |

* cited by examiner

Primary Examiner—Nicholas Ponomarenko
Assistant Examiner—Nguyen Hanh
(74) Attorney, Agent, or Firm—Jimmy L. Funke

(57) ABSTRACT

A heat sink device for retaining a heat dissipating object includes a substrate having an aperture configured therethrough to receive the object and an extruded portion extending from a surface of the substrate defining the aperture. The extruded portion is configured to receive the object and increase a surface area available for heat transfer from said object in said aperture relative to without said extruded portion.

26 Claims, 4 Drawing Sheets

APPARATUS AND METHOD FOR HEAT SINK DEVICE

TECHNICAL FIELD

This application relates generally to the field of heat sinks in an electrical apparatus. More specifically, this application relates to a metallic heat sink for a diode embedded therein of an electrical machine and a method of manufacturing the same.

BACKGROUND

Bridge rectifiers are used to rectify current output from alternative current sources, such as an alternating current generator. Bridge rectifiers for motor vehicle alternators are well known in the art and generally include two metal parts used as heat sinks that are electrically insulated from each other. As a result of the current which is transmitted therethrough, the bridge rectifier becomes heated due to the internal power loss on each individual diode. Thus, the bridge rectifier must be properly cooled in order to handle the maximum required current while still being tolerant to increased temperatures due to internal power losses.

Each of the metal parts or carrier plates includes semiconductor diodes which are arranged to polarize the two metal parts into respective positive and negative direct voltage output terminals. The diodes are then connected to respective phase windings of an output winding of the alternating current generator.

The rectifier diodes are connected to respective carrier plates, and these carrier plates are used as heat sinks for these diodes as well. The rectifier diodes are typically inserted by pressure in receiving bore holes of the carrier plate or heat sink, or are soldered to the carrier plate using appropriate solder alloys. The end wires connected to the rectifier diodes enable the rectifier diodes to be connected to external sources.

The heat sinks are typically constructed in the shape of a circle or crescent and are fastened in the same plane to the alternating current generator.

Various difficulties or problems have occurred using this standard diode rectifier. For example, one problem which has been experienced with diode rectifiers includes the need to carefully match the diode characteristics in order to avoid imbalance in the amount of current conducted by the individual diodes. If thermal imbalance is experienced, certain diodes will increase current flow which may result in thermal runaway. Thermal runaway involves a diode which is unable to regulate its current flow and temperature. In this situation, the diode conducts increased current and experiences increased temperature until the individual diode is no longer able to conduct such a high current or experience such a high temperature, and the diode becomes destroyed. Frequently, thermal runaway results in the destruction of an individual diode, and the destroyed diode becomes short circuited thereby rendering the entire bridge rectifier inoperative.

Another problem which has been encountered in bridge rectifiers is that the bridge rectifiers must not only be able to withstand normal battery charging current, but must also be able to supply current, perhaps as much as ten times the normal charging current. These increased current situations may occur, for example, when the motor vehicle is being started. Bridge rectifiers, as discussed, are typically unable to absorb or conduct these types of excess currents and are also unable to rapidly dissipate the resulting heat. Thus, the heat generated within the bridge rectifier may destroy the individual diodes. In order for bridge rectifiers to handle these types of excessive currents and heat, it becomes necessary to utilize a bridge rectifier which has higher current handling capability. Due to the space limitations of the alternating current generator, it then becomes very difficult to provide such a bridge rectifier from a feasibility standpoint as well as at an economical cost.

A further attempt at increasing the current capacity and heat dissipating characteristics of the bridge rectifier includes the mounting of semiconductor diode chips onto first and second metallic heat sinks which are electrically insulated from each other by a thin sheet of electrical insulating material. The diode chips are then covered by a protective insulating coating after connection to the respective heat sink. One of the metallic heat sinks includes a finned area which is subjected to cooling air when the bridge rectifier is mounted to the generator. The heat sink with the plurality of fins includes twelve air passages. This type of bridge rectifier is shown in U.S. Pat. No. 4,606,000 to Steele et al., incorporated herein by reference.

FIGS. 1a–1b are illustrations of a prior art bridge rectifier as depicted in U.S. Pat. No. 4,606,000 to Steele et al. In FIG. 1a, combined alternator cover and carrier plate 12 includes carrier plate or heat sink 14 connected to alternator cover 16 (only partially depicted to expose underlying plate 14). Carrier plate 14 includes receiving bore holes 18 which are formed for receiving the diodes. Carrier plate 14 includes alternator mounting holes 20 for mounting carrier plate 14 to the alternator cover 16 via standard connection means such as a bolt or screw connection. Alternator cover 16 includes three main alternator air passages which interact with the twelve air passages 26 in carrier plate 14, thereby cooling radiating fins 23. As depicted in FIG. 1b, carrier plate 14 is of a rectangular shape (in side view) having receiving bore holes 18 configured therethrough to receive a press fit diode 22 (partially shown) disposed within carrier plate 14. The temperature of the heat sink around the diode base 24 is highest and a demand for more current from a generator directly translates to more current through diode 22. Higher current flow through a diode increases the temperature of diode 22, specifically at diode base 24. In current design, diodes frequently operate in the extreme limits of thermal conditions, necessitating enhancements in cooling to meet future demand of higher current therethrough for various applications.

FIG. 2 is an illustration of the positioning of the bridge rectifier 11 within a standard alternating current generator generally designated with reference letter G. As depicted in FIG. 2, the completely assembled bridge rectifier 11 which includes carrier plate 14 and cover 11a is connected to alternator cover 16 via any standard connection means, such as screws 17. Reference numeral 13 denotes the bottom of carrier plate 14, while reference numeral 15 denotes the top of carrier plate 14. Bridge rectifier 11 is also connected to regulator 19. As mentioned previously, the standard bridge rectifier shown in Steele et al. and FIGS. 1a–1b are well known in the art.

While there have been, as described above, several attempts to increase the current and heat capacity of the bridge rectifier, none of these prior attempts have been completely satisfactory. That is, none of these prior art attempts have increased the current and heat capacity of the bridge rectifier in an economical manner.

As a result of the dissatisfaction with existing bridge rectifiers, there is a need to improve the performance characteristics of prior art bridge rectifiers. This problem resides in the poor performance characteristics of the carrier plate, and the resulting defects or failures which arise therefrom. In addition, there is a need for a carrier plate which increases the dissipation of heat from the diode and more efficiently cool the diode by facilitating increased surface area of the heat sink available to a diode resulting in an increased rate of dissipation of heat from the diode through the carrier plate in which the diode is disposed.

SUMMARY

A method and apparatus for increasing the rate of heat dissipation from an object is disclosed. The apparatus includes a heat sink device for retaining the heat dissipating object including a substrate having an aperture configured therethrough to receive the object and an extruded portion extending from a surface of the substrate defining the aperture. The extruded portion is configured to receive the object and increase a surface area available for heat transfer from said object in said aperture relative to without said extruded portion.

The method includes forming an aperture in a portion of a substantially planar substrate. The aperture is sized to receive the object therein. The method further includes extruding an extruded portion from the portion of said substrate forming the aperture. The extruded portion extends from a surface of the substrate defining the aperture. The extruded portion is configured to receive the object and increase a surface area available for heat transfer from the object in the aperture relative to without the extruded portion.

The above-described and other features and advantages of the present invention will be appreciated and understood by those skilled in the art from the following detailed description, drawings, and appended claims.

BRIEF DESCRIPTION OF THE DRAWINGS

FIG. 1b is a partial side view of the bridge rectifier of FIG. 1a;

DESCRIPTION OF THE PREFERRED EMBODIMENT

Figure 1A:
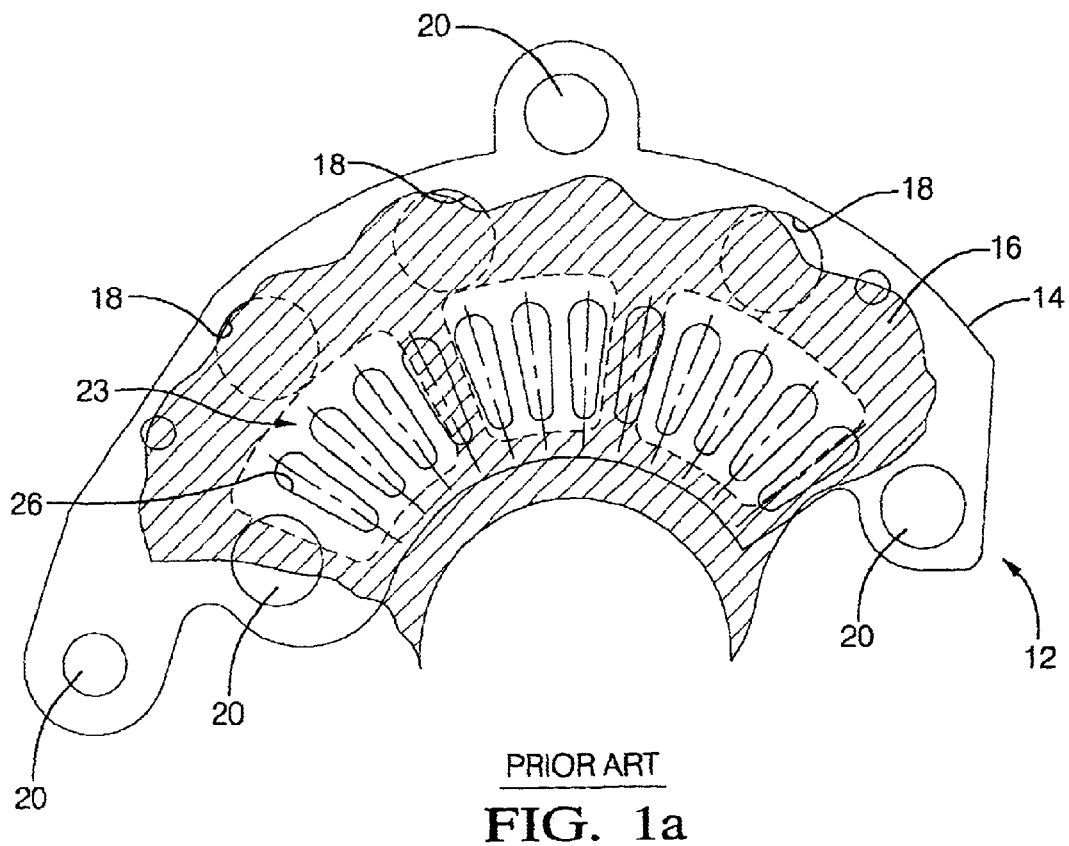
FIG. 1a is a bottom view of a bridge rectifier according to the prior art.
Figure 1B:
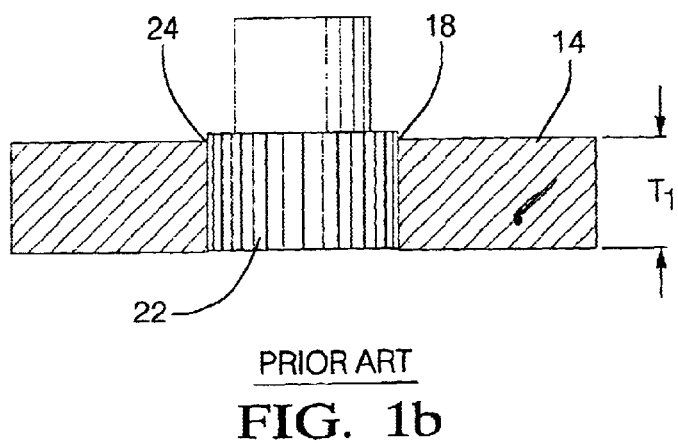
Figure 2:
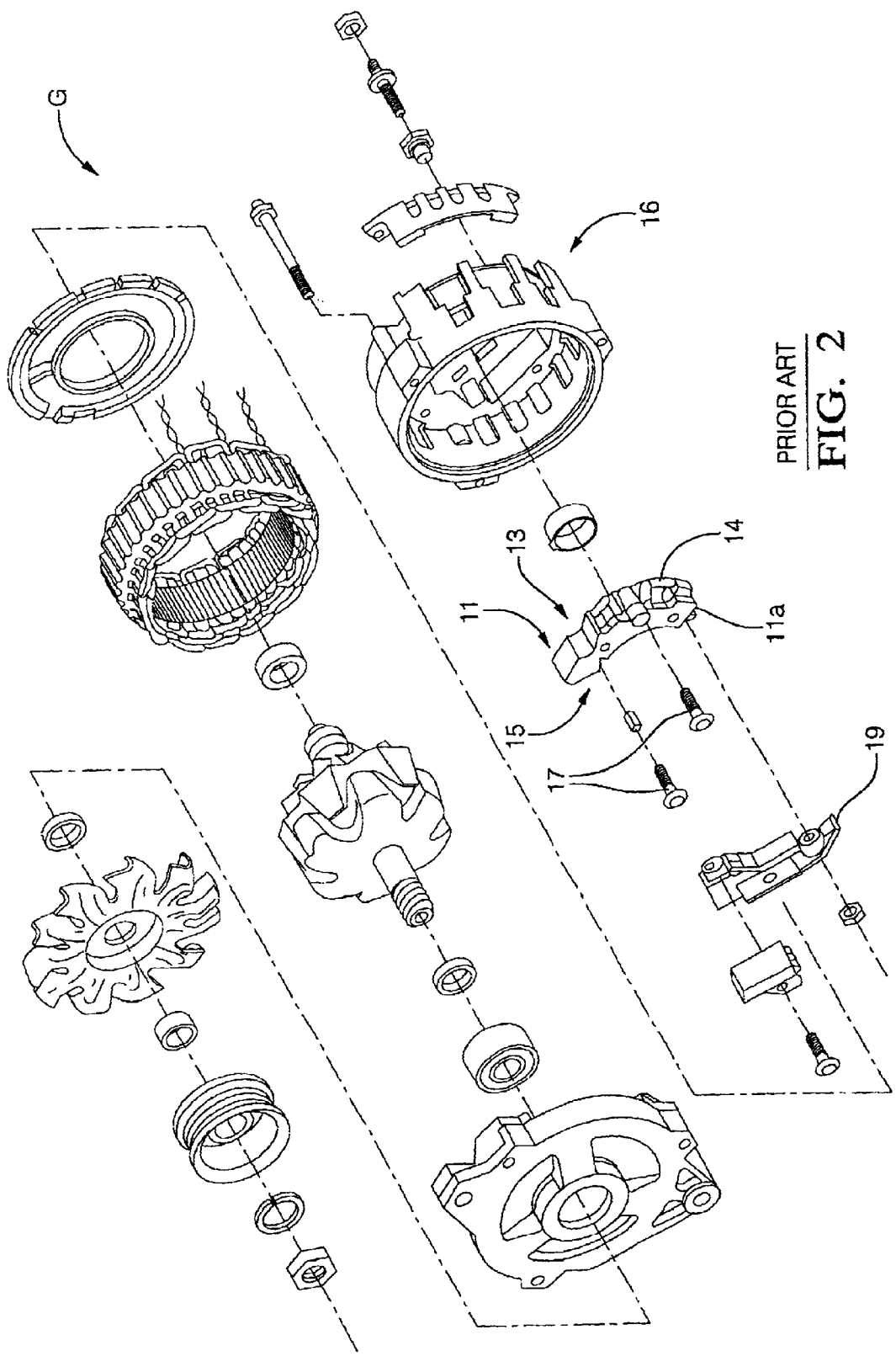
FIG. 2 is an exploded view showing the general connection of the bridge rectifier according to the prior art.
Figure 3:
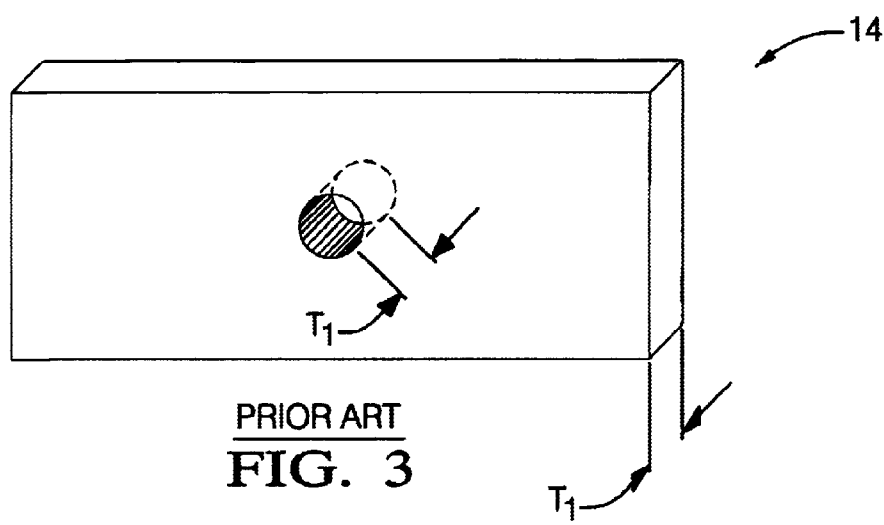
FIG. 3 is a perspective view of the bridge rectifier of FIG. 1b.

Referring to FIGS. 1b and 3, a side view and top perspective view of a conventional heat sink carrier plate 14 are shown, respectively. Carrier plate 14 is an aluminum plate having a stamped or machined bore 18 for receiving press fit diode 22. Plate 14 acts as a heat sink for dissipating heat generated in diode 22.

Figure 4:
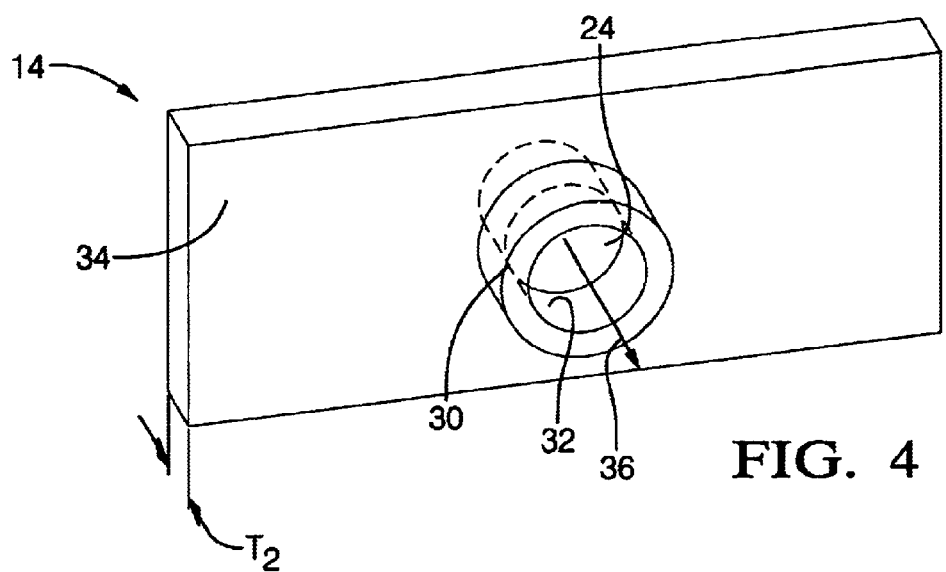
FIG. 4 is a perspective view of an exemplary embodiment of a heat sink carrier plate for a press-fit diode assembly.
Figure 5:
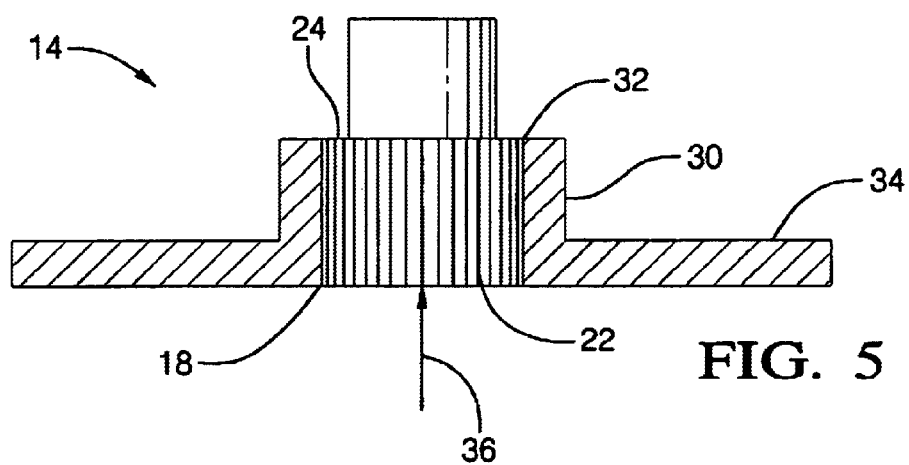
FIG. 5 is a cross sectional view a heat sink carrier plate having a diode press fit therewith in accordance with the exemplary embodiment of FIG. 4.
Figure 6:
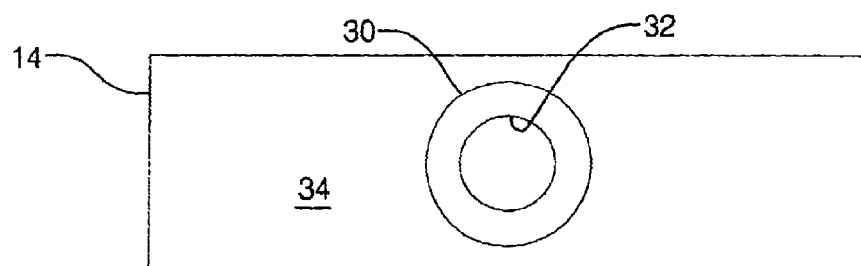
FIG. 6 is a top plan view of the heat sink carrier plate of FIG. 5.

Referring to FIGS. 4 and 5, a top perspective view, a side view and a top plan view of an exemplary embodiment of a carrier plate 14 are shown, respectively. Carrier plate 14 is preferably made from a thin soft aluminum plate having a thickness "T2" that is thinner than that of the plate shown in FIGS. 1b and 3 having a thickness "T1". It will be noted that the aluminum plate may be thin or soft, or both thin and soft. It will also be noted that carrier plate 14 is optionally fabricated from any thermally conductive metal including, but not limited to, copper, gold, silver, and steel, including combinations of at least one of the forgoing. In addition, it is also contemplated that a thermally conductive metal impregnated substrate such as a metal impregnated plastic is suitable to use for fabrication of carrier plate 14. In an exemplary embodiment, carrier plate 14 includes a punched bore 18 that is further rolled or extruded forming an extruded portion 30 extending from bore 18.

In an exemplary embodiment, extruded portion 30 includes a bore 32 having a diameter substantially equal to a diameter of bore 18 for press fit engagement with diode 22. It will be recognized by one skilled in the art that extruded portion 30 allows variable contact pressure between bores 18 and 32 dependent upon whether diode base 24 is aligned in the same plane as surface plane 34 defining a top surface of plate 14 (FIG. 4) or extending further in a direction indicated with arrow 36 into extruded portion 30 (FIG. 5), thus increasing contact pressure. It is also contemplated that bore 32 is optionally configured with threads to engage complementary threads on diode 22. It is further contemplated that extruded portion is optionally configured having an unequal height from a surface of carrier plate 14 around a perimeter defining bore 32. In such a manner, extruded portion 30 may be slanted in a side view perspective.

Extruded portion 30 increases the surface area available to diode 22 disposed in carrier plate 14 to increase a rate of dissipation of heat from diode 22. The surface area is increased by having surface area defining a periphery of extruded portion 30 in addition to surface plane 34 for surface area available for dissipation of heat from diode 22.

In tests comparing the operating temperature of diode 22 disposed in press fit engagement with plate 14 having extruded portion 30, diode 22 is cooler by about 5% to about 10% with the exemplary heat sink of FIGS. 3–6 and 9.

Figure 7:
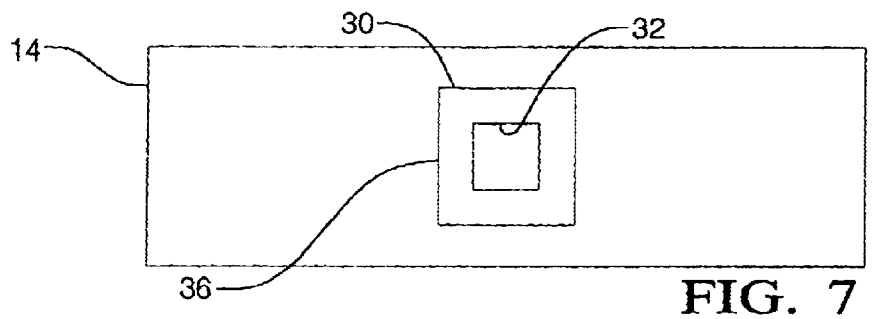
FIG. 7 is a top plan view of an alternative embodiment of the heat sink carrier plate of FIG. 6.

Referring to FIG. 7, an alternative embodiment for an extruded heat sink on carrier plate 14 is illustrated. Carrier plate 14 includes extruded portion 30 configured as a square box portion 36. Box portion 36 forms a square shaped bore 32 configured to provide press fit engagement with a periphery of diode 22 at four points on four sides defining box portion 36.

Figure 8:
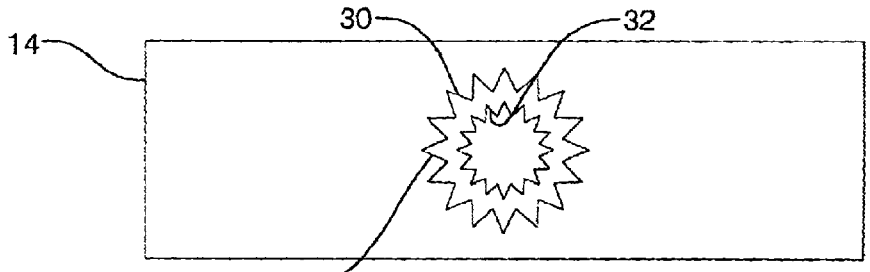
FIG. 8 is a top plan view of another alternative embodiment of the heat sink carrier plate of FIG. 6.

FIG. 8 illustrates another alternative embodiment for an extruded heat sink on carrier plate 14. Carrier plate 14 includes extruded portion 30 configured having multiple leafed portions extending from bore 32 to increase surface area available for heat transfer.

It will be recognized by one skilled in the pertinent art that extruded portion 30 may be configured in any number of geometric shapes in an effort to provide an aperture configured to contact diode 22 while increasing a surface area available for increasing the rate of heat transfer from diode 22. It will be also understood that extruded portion 30 may also be configured to provide added retention of diode 22.

Figure 9:
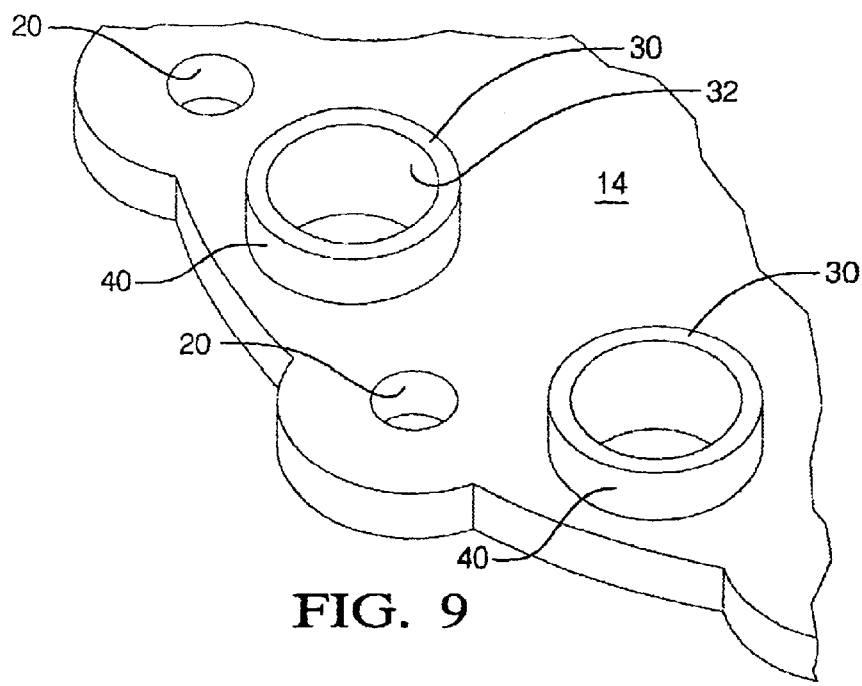
FIG. 9 is a top perspective view of an exemplary embodiment of a generator carrier plate configured with a plurality of heat sinks for a corresponding plurality of diodes.

FIG. 9 illustrates a plurality of heat sinks 40 configured in a generator carrier plate 14 for press fit retention of corresponding diodes (not shown) for use in a bridge rectifier in a motor vehicle. As motor vehicles require more electrical current to operate the increased and varied electronics in a motor vehicle, enhanced heat sinks are required to efficiently dissipate the heat generated as a result of the increased current in the diodes associated with the generator.

The electrical current through a diode creates heat. The beat affects negatively the current capability of a diode. Thus, temperature/current capability are in opposite relation. Over a given temperature a diode is destroyed. Therefore on an alternator which generates high current, it is most necessary to cool the diodes by heat sinks and improve the heat dissipation of the heat sinks by increasing the mass and flowing air over/through them.

The exemplary embodiments disclosed herein provide an improved bridge rectifier for an alternating current generator including a heat sink device having a extruded portion to increase a rate of heat dissipation relative to without the extruded portion. In addition, the improved bridge rectifier reduces the thickness of material necessary and reduces material scrap in making the same.

While the heat sink device has been described for use with generators associated with vehicles, the heat sink device may also be used and incorporated in applications other than generators for a vehicle where enhancement in cooling is required.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A heat sink device for retaining a heat dissipating object comprising:
    a substrate having an aperture configured therethrough to receive the object; and
    an extruded portion extending from a surface of said substrate defining said aperture, said extruded portion configured to receive the object and increase a surface area available for heat transfer from said object in said aperture relative to without said extruded portion,
    wherein the object is variably disposed along a length of said extruded portion for the purpose of controlling at least one of contact pressure between the object and said extruded portion and heat dissipation from the object.

2. The device as in claim 1, wherein said aperture is defined by a substrate wall having a length defining a thickness of said substrate and said extruded portion extends from one end of said substrate wall extending to a second length from said surface of said substrate, wherein at least one of said substrate wall and said extruded portion is configured to engage a periphery of the object.

3. The device as in claim 2, wherein said substrate wall and said extruded portion are integral with said substrate.

4. The device as in claim 3, wherein said substrate wall and said extruded portion are configured in a cylinder.

5. The device as in claim 4, wherein said object is a diode and said substrate is fabricated from one of a substantially planar thermally conductive metal stock or a thermally conductive metal impregnated substrate.

6. The device as in claim 5, wherein said metal stock is aluminum.

7. The device as in claim 5, wherein said substrate is formed with a plurality of extruded portions for a corresponding plurality of diodes for an electric machine.

8. The device as in claim 7, wherein said plurality of diodes form a rectifier for said electric machine.

9. The device as in claim 8, wherein said electric machine is one of a generator and an alternator for a vehicle.

10. The device as in claim 1, wherein said extruded portion allows said substrate to be thinner than without said extruded portion while allowing the object to be cooler by at least about 5%.

11. The device as in claim 1, wherein said extruded portion provides an increase in surface area in operable communication with the object for at least one of a higher rate of heat dissipation from the object and increased contact pressure on the object.

12. The device as in claim 11, wherein said higher rate of heat dissipation results in the object being at least about 5% cooler.

13. The device as in claim 1, wherein said extruded portion is configured for enhanced cooling and increased temperature tolerance of the object therein.

14. A method for making a heat sink for operably retaining an object therewith, the method comprising:
    forming an aperture in a portion of a substantially planar substrate, said aperture sized to receive the object therein; and
    extruding an extruded portion from said portion of said substrate forming said aperture, said extruded portion extending from a surface of said substrate defining said aperture, said extruded portion configured to receive the object and increase a surface area available for heat transfer from said object in said aperture relative to without said extruded portion,
    wherein the object is variably disposed along a length of said extruded portion for the purpose of controlling at least one of contact pressure between the object and said extruded portion and heat dissipation from the object.

15. The method as in claim 14, wherein said forming said aperture defines a substrate wall having a length defining a thickness of said substrate and said extruding said extruded portion extends from one end of said substrate wall extending to a second length from said surface of said substrate, wherein at least one of said substrate wall and said extruded portion is configured to engage a periphery of the object.

16. The method as in claim 15, wherein said substrate wall and said extruded portion are integral with said substrate.

17. The method as in claim 16, wherein said forming said aperture and extruding said extruded portion forms a cylinder.

18. The method as in claim 17, wherein the object is a diode and said substrate is fabricated from one of a substantially planar thermally conductive metal stock or a thermally conductive metal impregnated substrate.

19. The method as in claim 18, wherein said metal stock is aluminum.

20. The method as in claim 18, wherein said substrate is formed with a plurality of extruded portions for a corresponding plurality of diodes for an electric machine.

21. The method as in claim 20 wherein said plurality of diodes forms a rectifier for said electric machine.

22. The method as in claim 21, wherein said electric machine is one of a generator and an alternator for a vehicle.

23. The method as in claim 14, wherein said extruding said extruded portion allows said substrate to be thinner than without said extruding said extruded portion while allowing the object to be cooler by at least about 5%.

24. The method as in claim 14, wherein said extruding said extruded portion increases a surface area in operable communication with the object for at least one of a higher rate of heat dissipation from the object and increased contact pressure on the object.

25. The method as in claim 14, wherein said higher rate of heat dissipation results in the object being at least about 5% cooler.

26. The method as in claim 14, wherein said extruded portion enhances cooling and increases temperature tolerance of the object therein.

* * * * *